United States Patent
Safai et al.

(10) Patent No.: US 9,515,034 B2
(45) Date of Patent: Dec. 6, 2016

(54) BOND PAD HAVING A TRENCH AND METHOD FOR FORMING

(71) Applicants: Sohrab Safai, Austin, TX (US); David B. Clegg, Austin, TX (US); Tu-Anh N. Tran, Austin, TX (US)

(72) Inventors: Sohrab Safai, Austin, TX (US); David B. Clegg, Austin, TX (US); Tu-Anh N. Tran, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 26 days.

(21) Appl. No.: 14/147,238

(22) Filed: Jan. 3, 2014

(65) Prior Publication Data
US 2015/0194396 A1  Jul. 9, 2015

(51) Int. Cl.
*H01L 23/00* (2006.01)
*H01L 23/485* (2006.01)
*B23K 20/00* (2006.01)

(52) U.S. Cl.
CPC ............ *H01L 24/03* (2013.01); *H01L 24/05* (2013.01); *H01L 24/08* (2013.01); *H01L 24/43* (2013.01); *H01L 24/48* (2013.01); *B23K 20/004* (2013.01); *B23K 20/005* (2013.01); *B23K 20/007* (2013.01); *H01L 23/485* (2013.01); *H01L 24/45* (2013.01); *H01L 24/85* (2013.01); *H01L 2224/02166* (2013.01); *H01L 2224/03831* (2013.01); *H01L 2224/04042* (2013.01); *H01L 2224/05558* (2013.01); *H01L 2224/08059* (2013.01); *H01L 2224/43* (2013.01); *H01L 2224/45147* (2013.01);
(Continued)

(58) Field of Classification Search
CPC .......... H01L 2224/05551; H01L 2224/05557; H01L 2224/05558; H01L 2224/08059; H01L 2224/43; H01L 2224/48; H01L 24/03; H01L 24/43; H01L 24/48; H01L 2924/01013; H01L 24/05; H01L 24/08
See application file for complete search history.

(56) References Cited

U.S. PATENT DOCUMENTS 5,235,212 A  8/1993 Shimizu et al.
5,407,862 A  4/1995 Miyamoto
(Continued)

FOREIGN PATENT DOCUMENTS

EP  2339622 A1  6/2011
JP  201210941 A  *  6/2012
JP  2012109419 A  6/2012

OTHER PUBLICATIONS

Nguyen, L.T., et al, "Optimization of copper wire bonding on Al—Cu metallization", IEEE Transactions on Components, Packaging, and Manufacturing Technology—Part A, vol. 18, No. 2, (1995), pp. 423-429.*
(Continued)

*Primary Examiner* — Phat X Cao
*Assistant Examiner* — Diana C Vieira

(57) ABSTRACT

A conductive structure is formed in a last metal layer of an integrated circuit. Passivation material is patterned over a portion of the conductive structure. A first trench is patterned around a selected portion of the passivation material. The selected portion represents a bond region of a wire bond to be formed above the passivation material. A portion of the passivation material completely covers a bottom of the trench. A layer of conductive material is conformally deposited over the passivation material. The conformal depositing resulting in a second trench forming in the conductive material over the first trench in the passivation material. The second trench is positioned to contain at least a portion of a splash of the conductive material when the wire bond is subsequently formed.

20 Claims, 5 Drawing Sheets

(52) U.S. Cl.
CPC .. *H01L 2224/48* (2013.01); *H01L 2224/48463* (2013.01); *H01L 2224/78301* (2013.01); *H01L 2224/85181* (2013.01); *H01L 2224/85205* (2013.01); *H01L 2924/01013* (2013.01)

(56) References Cited

U.S. PATENT DOCUMENTS

| | | | |
|---|---|---|---|
| 5,834,365 | A | 11/1998 | Ming-Tsung et al. |
| 5,942,800 | A | 8/1999 | Yiu et al. |
| 6,110,816 | A | 8/2000 | Huang et al. |
| 6,306,750 | B1 | 10/2001 | Huang et al. |
| 6,387,734 | B1 * | 5/2002 | Inaba et al. .................. 438/125 |
| 6,596,628 | B2 | 7/2003 | Magara |
| 7,169,694 | B2 | 1/2007 | Pozder et al. |
| 7,535,078 | B2 | 5/2009 | Kobayashi et al. |
| 7,646,097 | B2 | 1/2010 | Yu et al. |
| 7,888,259 | B2 | 2/2011 | Zbrzezny et al. |
| 7,969,021 | B2 | 6/2011 | Uno et al. |
| 8,552,560 | B2 * | 10/2013 | Bhatt et al. .................. 257/758 |
| 8,846,520 | B2 * | 9/2014 | Matsuda ....................... 438/613 |
| 2002/0089062 | A1 | 7/2002 | Saran et al. |
| 2004/0135223 | A1 | 7/2004 | Allman et al. |
| 2005/0206007 | A1 | 9/2005 | Li et al. |
| 2005/0215048 | A1 | 9/2005 | Li et al. |
| 2007/0102182 | A1 | 5/2007 | Okada et al. |
| 2007/0102812 | A1 | 5/2007 | Sun et al. |
| 2007/0114667 | A1 | 5/2007 | Bhatt et al. |
| 2007/0134903 | A1 | 6/2007 | Ryan |
| 2008/0111244 | A1 | 5/2008 | Tessmer et al. |
| 2008/0179745 | A1 | 7/2008 | Hess et al. |
| 2012/0001336 | A1 | 1/2012 | Zeng et al. |
| 2013/0001777 | A1 | 1/2013 | Veychard et al. |

OTHER PUBLICATIONS

R. Schueller "Copper wire bond failure mechanisms", DfR Solutions, 2012.*

T. C. Wei, A. R. Daud, "Cratering on Thermosonic Copper Wire Ball Bonding", Journal of Materials Engineering and Performance, vol. 11, Issue 3, pp. 283-287, Jun. 2002.*

U.S. Appl. No. 14/147,234, filed Jan. 3, 2014, Safai, S. et al., "Bond Pad Having a Trench and Method for Forming", Office Action—Restriction, mailed Apr. 24, 2015.

U.S. Appl. No. 14/042,662, filed Sep. 30, 2013, Tran, T. et al., "Electronic Component Package and Method for Forming Same", Office Action—Restriction, mailed May 4, 2015.

U.S. Appl. No. 14/147,234, filed Jan. 3, 2014, Safai, S. et al., "Bond Pad Having a Trench and Method for Forming", Office Action—Rejection, mailed Aug. 12, 2015.

U.S. Appl. No. 14/042,662, filed Sep. 30, 2013, Tran, T. et al., "Electronic Component Package and Method for Forming Same", Office Action—Rejection, mailed Sep. 14, 2015.

U.S. Appl. No. 14/147,234, Safai, S., "Bond Having a Trench and Method for Forming", Office Action—Final Rejection, mailed Feb. 8, 2016.

U.S. Appl. No. 14/042,662, Tran, T., "Electronic Component Package and Method for Forming", Office Action—Notice of Allowance, mailed Mar. 31, 2016.

U.S. Appl. No. 14/042,662, Tran, T. et al., "Electronic Component Package and Method for Forming Same", Office Action—Notice of Allowance, mailed Jul. 6, 2016.

U.S. Appl. No. 14/147,234, Safai, S. et al., "Bond Pad Having a Trench and Method for Forming", Office Action—Non-Final Rejection, mailed Jul. 25, 2016.

* cited by examiner

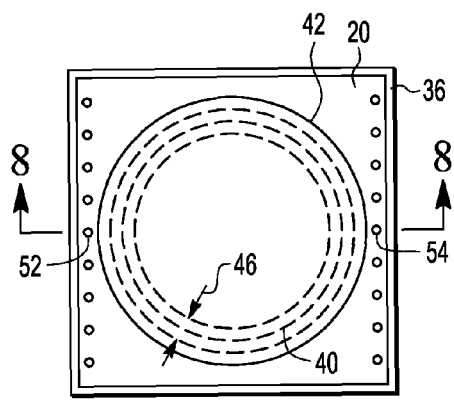
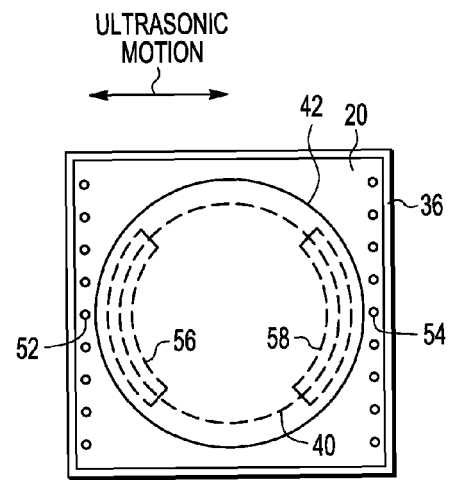
FIG. 9  FIG. 10
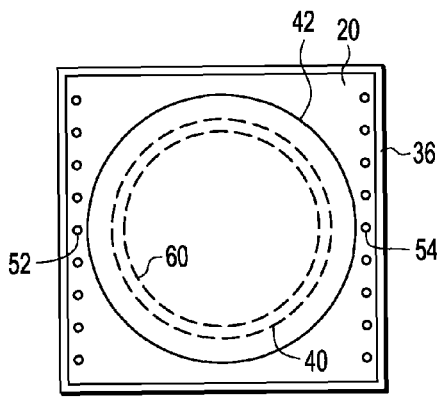
FIG. 11

BOND PAD HAVING A TRENCH AND METHOD FOR FORMING

BACKGROUND

Field

This disclosure relates generally to semiconductor processing, and more specifically, to forming a bond pad having a trench.

Related Art

Wire bonds provide electric connections to underlying circuitry within a semiconductor device. The ball bond of a wire bond is attached to a bond pad formed on the semiconductor device. For example, copper is commonly used for the wire bond and aluminum is commonly used as the bond pad. The bond pads of a semiconductor device are physically separated from each other, and the spaces between adjacent bond pads typically include passivation. However, during the bonding process, when the ball bond of the wire bond is attached to the aluminum bond pad, the aluminum pad deforms resulting in an aluminum splash which extends from under the ball bond. This aluminum splash may result in passivation cracking. The cracks in passivation may result in reliability failures of the semiconductor device.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 9 illustrates a top-down view of the semiconductor structure of FIG. 8, in accordance with an embodiment of the present invention.

FIG. 10 illustrates a top-down view of a semiconductor structure in accordance with another embodiment of the present invention.

FIG. 11 illustrates a top-down view of a semiconductor structure in accordance with another embodiment of the present invention.

DETAILED DESCRIPTION

During wire bonding, a conductive splash forms when the ball bond of a wire bond is attached onto a bond pad of a semiconductor device. The majority of this conductive splash is typically formed in the direction of the ultrasonic vibration of the wire bonder's transducer. In one embodiment, a trench is formed in the bond pad which is positioned and sized to contain at least a portion of the splash. This trench is formed by patterning a trench in a passivation layer which underlies the bond pad. A partial etch is performed such that the trench in the passivation layer does not extend through an entire thickness of the passivation layer. The bond pad is formed from a conductive layer which is conformally deposited over the passivation layer. The trenches in the passivation layer result in trenches being formed in the conformal conductive layer used for forming the bond pad.

Figure 1:
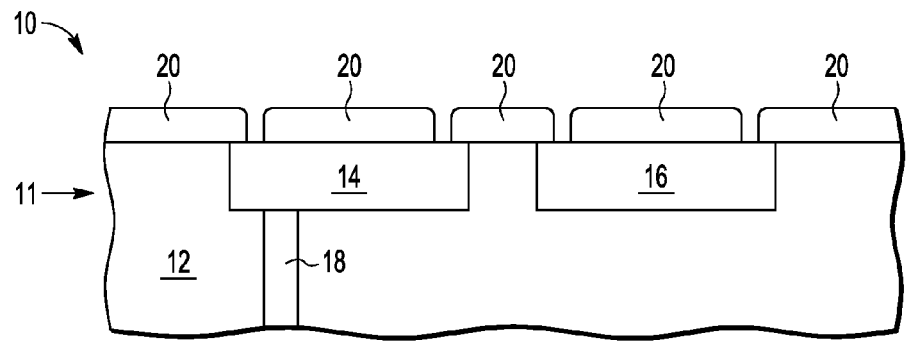
FIG. 1 illustrates a cross-sectional view of a semiconductor structure at a stage of processing in accordance with an embodiment of the present invention.

FIG. 1 illustrates, in a cross-sectional view, a semiconductor structure 10 (also referred to as an integrated circuit) which includes a last metal layer 11 formed within an interlayer dielectric layer (ILD) 12. Although not illustrated in FIG. 1, semiconductor structure 10 includes active circuitry formed on and in a semiconductor substrate and having a plurality of interconnect layers formed over the active circuitry. Each interconnect layer may include interlayer conductive portions (e.g. to route signals within a layer) and intralayer conductive portions (e.g. to route signals between layers). Last metal layer 11 corresponds to the last metal layer of the interconnect layers. Last metal layer includes conductive structures 14 and 16. Semiconductor structure 10 also includes a conductive via 18 which extends from conductive structure 14 to an underlying interconnect layer. Conductive via 18, which corresponds to an interlayer conductive portion, may be considered as part of last metal layer 11. Note that the interconnect layers provide electrical connections between the conductive structures of last metal layer 11, such as conductive structures 14 and 16, to the underlying active circuitry. Semiconductor structure 10 also includes a passivation layer 20 formed over last metal layer 11. Passivation layer 20 is patterned to form openings which expose potions of underlying conductive structures 14 and 16.

Figure 2:
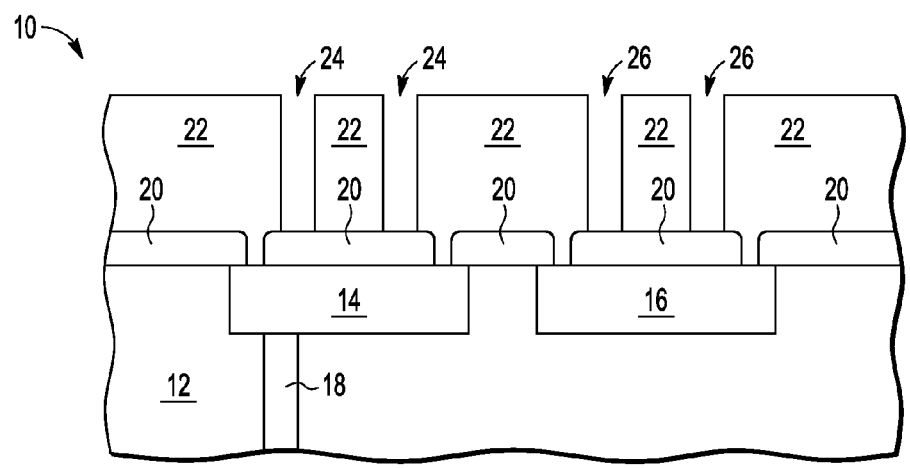
FIG. 2 illustrates a cross-sectional view of the semiconductor structure of FIG. 1 at a subsequent stage of processing in accordance with an embodiment of the present invention.

FIG. 2 illustrates, in a cross-sectional view, semiconductor structure 10 after formation of a photoresist layer 22 over passivation layer 20. Photoresist layer 22 is patterned to form openings 24 and 26. Opening 24 is formed over a portion of passivation layer 20 which is located directly over conductive structure 14, and opening 26 is formed over a portion of passivation layer 20 which is located directly over conductive structure 16. In the illustrated embodiment, opening 24 is a continuous opening surrounding a selected portion of the underlying portion of passivation layer 20, and opening 26 is a continuous opening surround a selected portion of the underlying portion of passivation layer 20.

Figure 3:
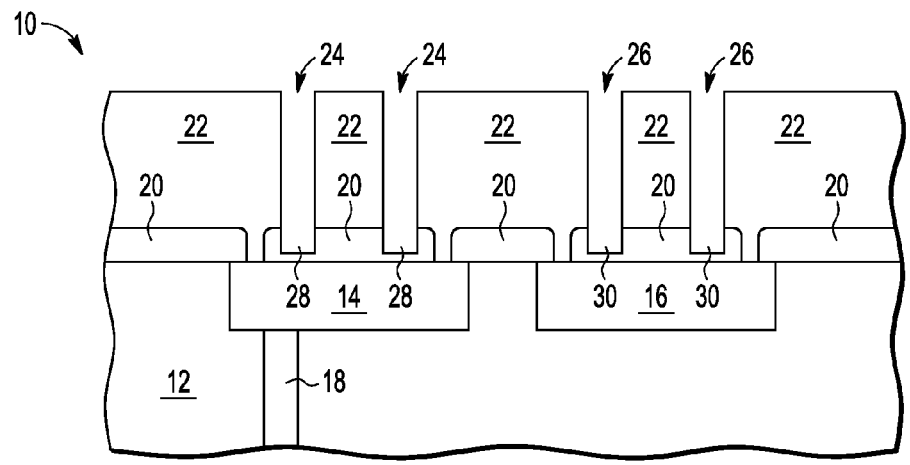
FIG. 3 illustrates a cross-sectional view of the semiconductor structure of FIG. 2 at a subsequent stage of processing in accordance with an embodiment of the present invention.

FIG. 3 illustrates, in cross-sectional view, semiconductor structure 10 after patterning passivation layer 20 to form a trench 28 directly over conductive structure 14 and a trench 30 directly over conductive structure 16. In one embodiment, a partial etch is performed into passivation layer 20 using opening 24 to form trench 28 and using opening 26 to form trench 30. Note that trenches 28 and 30 do not extend through an entire thickness of passivation layer 20. That is, a portion of passivation material 20 completely covers a bottom of trench 28 and a bottom of trench 30. Note that trench 28 surrounds a selected portion of passivation layer 20 over conductive structure 14 which represents a bond region of a wire bond to be formed above passivation layer 20. Similarly, trench 30 surrounds a selected portion of passivation layer 20 over conductive structure 16 which represents a bond region of a wire bond to be formed above passivation layer 20.

Figure 4:
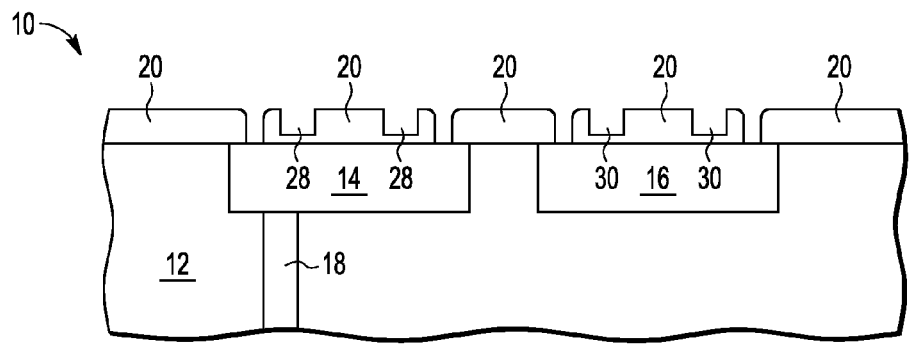
FIG. 4 illustrates a cross-sectional view of the semiconductor structure of FIG. 3 at a subsequent stage of processing in accordance with an embodiment of the present invention.

FIG. 4 illustrates, in a cross-sectional view, semiconductor structure 10 after removal of patterned photo resist layer 22.

Figure 5:
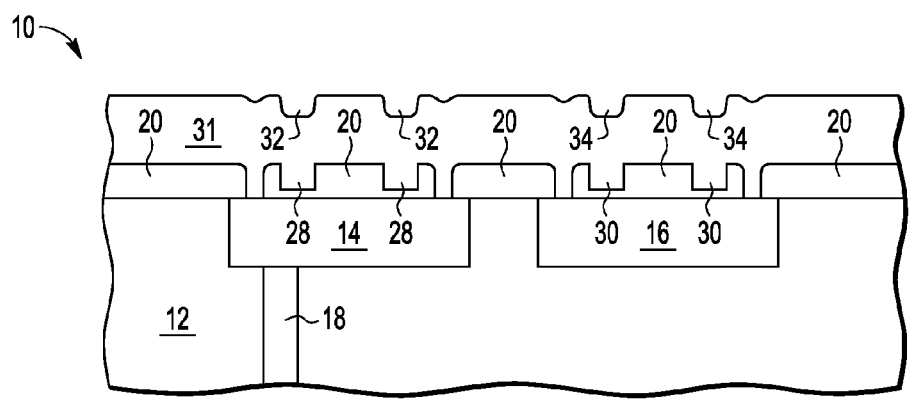
FIG. 5 illustrates a cross-sectional view of the semiconductor structure of FIG. 4 at a subsequent stage of processing in accordance with an embodiment of the present invention.

FIG. 5 illustrates, in a cross-sectional view, semiconductor structure 10 after formation of a conductive layer 31 over passivation layer 20. Conductive layer 31 is conformally deposited over passivation layer 20. In one embodiment, conductive layer 31 is formed with a blanket deposition Conductive layer 31 includes a conductive material, such as aluminum. Therefore, in one embodiment, conductive layer 31 is an aluminum layer.

Figure 6:
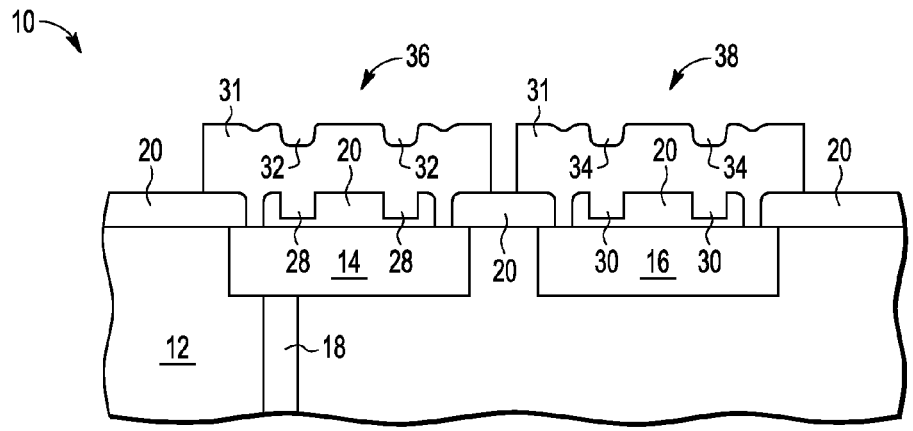
FIG. 6 illustrates a cross-sectional view of the semiconductor structure of FIG. 5 at a subsequent stage of processing in accordance with an embodiment of the present invention.

FIG. 6 illustrates, in a cross-sectional view, semiconductor structure 10 after patterning conductive layer 31 to form a bond pad 36 which directly contacts conductive structure 14 through the openings of passivation layer 20 over conductive structure 14 and a bond pad 38 which directly contacts conductive structure 16 through the openings of passivation layer 20 over conductive structure 16. Bond pad 36 includes trench 32 which is positioned directly over trench 28 and bond pad 38 includes trench 34 which is positioned directly over trench 30. Bond pads 36 and 38 are physically separate from each other and each will be capable of receiving an external connection, such as a wire bond connection. Note that any number of bond pads may be formed from conductive layer 21 over passivation layer 20 in which each bond pad may be in physical contact with an underlying conductive portion of last metal layer 11. Also, each bond pad will include a trench as a result of a trench formed in underlying passivation layer 20. The bond pads, such as bond pads 36 and 38, allow for external connections to be made to structure 11, such as with wire bonds, and may therefore also be referred to as external bond pads.

Figure 7:
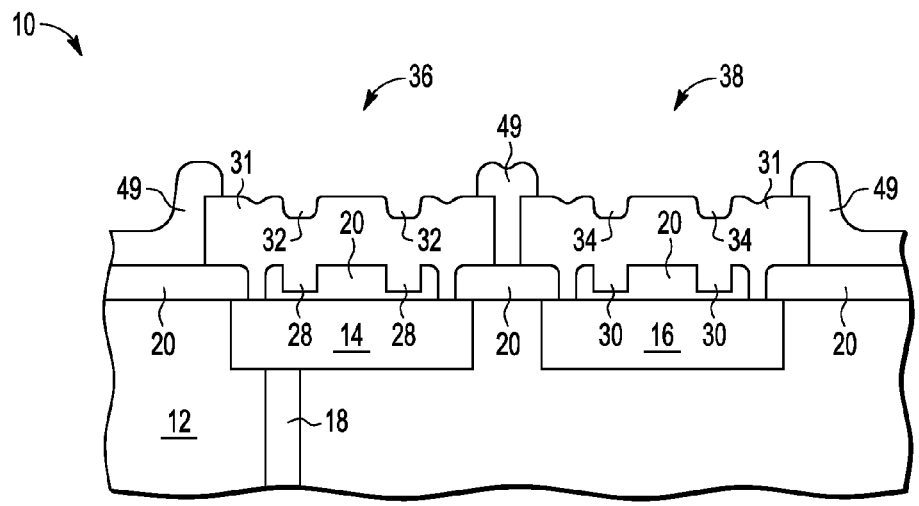
FIG. 7 illustrates a cross-sectional view of the semiconductor structure of FIG. 6 at a subsequent stage of processing in accordance with an embodiment of the present invention.

FIG. 7 illustrates, in cross-sectional view, semiconductor structure 10 after formation of a patterned passivation layer 49 over passivation layer 20 and bond pads 36 and 38. Passivation layer 49 exposes bond pad 36 and trench 32, and exposes bond pad 38 and trench 34. Portions of patterned passivation layer 49 are therefore formed between adjacent bond pads such as bond pads 36 and 38.

Figure 8:
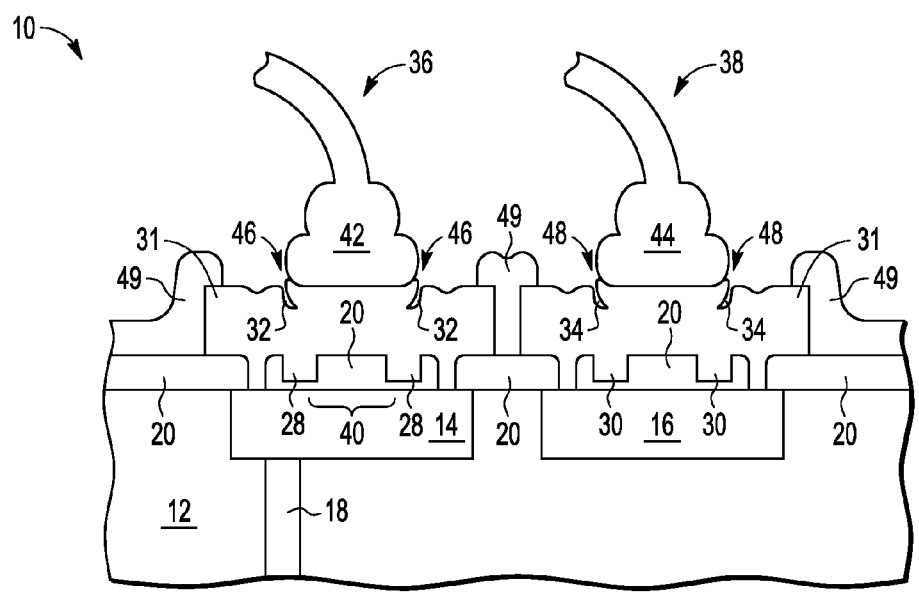
FIG. 8 illustrates a cross-sectional view of the semiconductor structure of FIG. 7 at a subsequent stage of processing in accordance with an embodiment of the present invention.

FIG. 8 illustrates, in a cross-sectional view, semiconductor structure 10 after wire bond connections are formed on the bond pads. Each wire bond connection includes a ball bond that is attached to a wire bond region of a corresponding bond pad. As illustrated in FIG. 8, ball bond 42 is attached to wire bond region 40 of bond pad 36 and ball bond 44 is attached to the wire bond region of bond pad 38. Note that upon attaching the wire bonds to the bond pads, a splash results. In the case of aluminum bond pads, these may be referred to as aluminum splashes. For example, splash 46 is formed due to the deformation of bond pad 36 that occurs during attachment of ball bond 42. Splash 46 corresponds to deformed portions of bond pad 36 and are formed in the direction of the ultrasonic vibration of the wire bonder's transducer. Similarly, splash 48 is formed due to the deformation of bond pad 38 that occurs during attachment of ball bond 44. Splash 48 corresponds to deformed portions of bond pad 38 which are formed in the direction of ultrasonic vibration of the wire bonder's transducer. In one embodiment, note that a material used to form the wire bond is harder (e.g. twice as hard) than a material used to form the bond pads. For example, in one embodiment, the wire bonds are copper and the bond pads are aluminum.

Note that splash 46 expands into trench 32 and splash 48 expands into trench 34. Therefore, note that trench 32 may be positioned and sized to contain at least a portion of splash 46, and trench 34 may be positioned and sized to contain at least a portion of splash 48. Also, as will be described in more detail below, each bond pad may include one or more trenches. The one or more trenches in each bond pad may be formed in an area where the splash will form when a wire bond is attached to a wire bond region of the bond pad. In one embodiment, the one or more trenches in each bond pad may have a volume large enough to contain at least 40% of the splash. Note also that ball bonds 42 and 44 experience deformation during attachment to bond pads 36 and 38.

FIG. 9 illustrates a top down view of bond pad 36 semiconductor structure 10 of FIG. 8 in accordance with one embodiment of the present invention. The perimeter of bond pad 36 is surrounded by passivation layer 49. Within bond pad 36, a solid circle labeled as 42 represents the perimeter of ball bond 42. The second dotted circle in from the perimeter of ball bond 42 represents wire bond region 40 of bond pad 36. The first and third dotted circles from the perimeter of ball bond 42 represent the inner and outer edges of trench 32. As can be seen in the embodiment of FIG. 9, trench 32 is formed at the perimeter of the wire bond region. Also, trench 32 is continuous around wire bond region 40. Also illustrated in FIG. 9 are conductive vias 52 and 54 which may be located along the perimeters of bond pad 36, located outside the perimeter of ball bond 42.

FIG. 10 illustrates a top down view of bond pad 36 of semiconductor structure 10 of FIG. 8 in accordance with another embodiment of the present invention in which in place of a single trench 32, two trenches, trench 56 and 58, are formed. In this embodiment, opening 28 in passivation layer 20 over conductive structure 14 may correspond to separate openings on opposite sides of bond region 40, and may therefore correspond to trenches 56 and 58. That is, rather than having a single continuous trench 32, multiple trenches may be used and positioned where the splash is formed. For example, trenches 56 and 58 may be positioned in accordance with the direction of ultrasonic vibration of the wire bonder's transducer. That is, the splashes may be formed in the direction of the vibration, therefore, trenches 56 and 58 may be formed perpendicular to this direction in order to capture the splash. Also, note that trenches 32, 56, and 58 may have difference shapes. For example, they may be rectangular in shape rather than curved. The shapes, location, and sizes of the trenches in the bonding pads are determined by the trenches formed in the underlying passivation layer (e.g. passivation layer 20 in the illustrated embodiment).

FIG. 11 illustrates a top down view of bond pad 36 of semiconductor structure 10 of FIG. 8 in accordance with another embodiment of the present invention in which in a trench may extend to the edge of bond pad 36, thus creating a thinner portion of bond pad 36 at a perimeter of bond pad 36. That is, the portion of bond pad 36 located within boundary 60 would be thicker than the portions of bond pad 36 located outside of boundary 60. The portions of passivation layer 20 outside of boundary 60 would be etched with a partial etch, just as described in reference to trench 28, but would extend to the sidewall of passivation layer 20.

Figure 12:
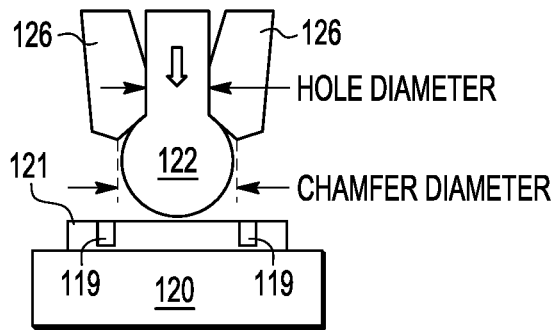
FIGS. 12-13 illustrate cross-sectional views of an example wire bonding sequence, in accordance with one embodiment of the present invention.
Figure 13:
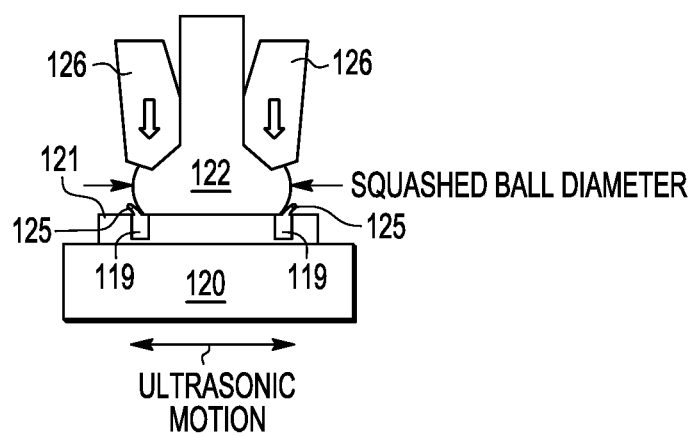

As will be described below, each of the trenches described above in reference to FIGS. 9-11 can be formed such that an inner edge (e.g. inner edge of trench 32, or trenches 56 and 58, or trench extending from boundary 60) of the one or more trenches is positioned at or beyond an expected outer edge of a capillary chamfer region of ball bond 42. For example, FIGS. 12 and 13 illustrate a step-by-step overview of an example wire bonding sequence for bonding a copper wire bond to an aluminum bond pad. As shown in FIG. 12, the bonding process begins with a threaded capillary 126 that is positioned above bond pad 121 formed on a semiconductor structure 120. In particular, capillary 126 is threaded with a copper wire conductor and ball bond 122. In an example sequence, a copper wire conductor is inserted or threaded through a central opening in the capillary having a specified hole diameter, followed by formation of ball bond 122 at the end of the wire conductor, such as by using an electrical flame off (EFO) process to form a free air ball. In capillary 126, the free air ball portion is captured in the capillary's chamfer portion having a specified chamfer diameter.

As shown in FIG. 13, capillary 126 with copper wire conductor and ball bond 122 descends or moves down to the wire bond region (which may also be referred to as the bond site) on bond pad 121. By applying downward force from capillary 126 to bond pad 121 and structure 120, the ball bond 122 is deformed to form a squashed ball bond. In addition, the deformation of ball bond 122 leaves an impression deformity in ball bond 122 that corresponds to the shaped of the impressed chamfer. In the example, the depicted impression deforming is a v-shaped impression defined by a low point in the upper surface of the squashed ball bond.

Afterwards, the ball bonding process may include a specified combination of heat, pressure and ultrasonic energy to form an intermetallic connection or weld between ball bond 122 and bond pad 121. During this process, splashes 125 are formed. However, trench 119 operates to contain at least a portion of the splash. In one embodiment, ball 122 corresponds to ball 42, bond pad 121 to bond pad 36, trench 119 to trench 32, trenches 56 and 58, or the trench extending from boundary 60, and splashes 125 to splashes 46. Therefore, note that by forming trench 119 such that an inner edge of trench 119 is positioned at or beyond an expected outer edge of a capillary chamfer region of bond ball 122, trench 119 may be positioned to contain a sufficient amount of the splash. In this manner, passivation cracking may be reduced which typically occurs with the splashes when trench 119 is not present.

By now it should be appreciated that there has been provided a bond pad with trenches sized and positioned to capture at least a portion of any splashes formed during the wire bond process. Each bond pad may include a single trench or a plurality of trenches. In this manner, passivation cracking between the bond pads may be reduced, thus increasing yield.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the trenches may have different configurations and shapes, as needed, to contain or reduce the splashes. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In accordance with one embodiment of the present invention, a method includes forming a conductive structure in a last metal layer of an integrated circuit; patterning passivation material over a portion of the conductive structure; patterning a first trench around a selected portion of the passivation material, the selected portion represents a bond region of a wire bond to be formed above the passivation material, a portion of the passivation material completely covers a bottom of the trench; and conformally depositing a layer of conductive material over the passivation material, the conformal depositing resulting in a second trench forming in the conductive material over the first trench, the second trench is positioned to contain at least a portion of a splash of the conductive material when the wire bond is subsequently formed. In a further embodiment, a material used to form the wire bond is harder than the conductive material. In another embodiment, the second trench is continuous around the perimeter of the wire bond region. In another further embodiment, the method further includes patterning a plurality of the first trenches around a perimeter of the wire bond region, the conformally depositing the layer of conductive material causing a plurality of the second trenches to form in the conductive material over the first trenches, the second trenches are positioned to contain at least a portion of the splash when the wire bond is formed. In another further embodiment, the conductive material includes aluminum and a material used to form the wire bond includes copper. In another embodiment, the second trench is positioned in an area where the splash will form when the wire bond is subsequently formed in the wire bond region. In another further embodiment, a volume of the second trench is large enough to contain at least 40 percent of the splash. In another further embodiment, an inner edge of the second trench is positioned at or beyond an expected outer edge of a capillary chamfer region of the wire bond. In another further embodiment, a material used to form the wire bond is at least twice as hard as the conductive material.

In accordance with another embodiment of the present invention, a method includes receiving an integrated circuit that includes an external bond pad and a passivation layer under the external bond pad, the passivation layer includes a first trench that extends only partially through the passivation layer so that a portion of the passivation layer remains between the external bond pad and a last metal layer of the integrated circuit and a portion of the external bond pad fills the first trench, and the external bond pad includes a second trench over the first trench, the second trench is positioned around at least a portion of a perimeter of a wire bond region; and forming a wire ball bond in the wire bond region of the external bond pad, a splash of the external bond pad moves into the second trench as the ball bond is formed. In one embodiment, a volume of the second trench is large enough to contain at least 40 percent of the splash. In a further embodiment of the another embodiment, a material used to form the wire bond is harder than a material used to form the external bond pad. In another embodiment, the second trench is continuous around the perimeter of the wire bond region. In another further embodiment of the another embodiment, the passivation layer and the external bond pad include a respective plurality of the first and second trenches around the perimeter of the wire bond region, the second trenches are positioned and sized to contain at least a portion of the splash of the conductive bond pad when the wire bond is formed in the wire bond region. In another further embodiment of the another embodiment, the passivation layer is over only a portion of the last metal layer and the external bond pad directly contacts another portion of the last metal layer. In another embodiment, an inner edge of the second trench is positioned at or beyond an expected outer edge of a capillary chamfer region of the wire bond.

In accordance with yet another embodiment of the present invention, a semiconductor device includes an integrated circuit including an external bond pad, the external bond pad includes a trench around at least a portion of a perimeter of a wire bond region; a passivation layer under the external bond pad, the passivation layer including a trench extending only partially through a thickness of the passivation layer, the trench in the passivation layer is positioned directly under the trench in the external bond pad; and a wire bond formed in the wire bond region, at least a portion of a splash of the external bond pad is contained in the trench in the external bond pad. In a further embodiment of the yet another embodiment, an inner edge of the trench in the external bond pad is positioned at or beyond an outer edge of a capillary chamfer region of the wire bond. In one embodiment, a volume of the trench in the external bond pad is large enough to contain at least 40 percent of the splash. In another further embodiment of the yet another embodiment, the device further includes a last metal layer contact in the integrated circuit, the passivation layer covers only a portion of the last metal layer contact and the external bond pad is in direct contact with another portion of the last metal layer contact.

What is claimed is:

1. A method comprising:
   forming a conductive structure in a last metal layer of an integrated circuit;
   patterning passivation material over a portion of the conductive structure;
   patterning a first trench around a selected portion of the passivation material, the selected portion represents a bond region of a wire bond to be formed above the passivation material, a portion of the passivation material completely covers a bottom of the trench, wherein an inner edge of the first trench is positioned at or beyond an expected outer edge of a capillary chamfer region of the wire bond;
   conformally depositing a layer of conductive material over the passivation material, the conformal depositing resulting in a second trench forming in the conductive material directly over the first trench, the second trench is positioned to contain at least a portion of a splash of the conductive material when the wire bond is subsequently formed.

2. The method of claim 1 wherein a material used to form the wire bond is harder than the conductive material.

3. The method of claim 1 wherein the second trench is continuous around the perimeter of the wire bond region.

4. The method of claim 1 further comprising patterning a plurality of the first trenches around a perimeter of the wire bond region, the conformally depositing the layer of conductive material causing a plurality of the second trenches to form in the conductive material over the first trenches, the second trenches are positioned to contain at least a portion of the splash when the wire bond is formed.

5. The method of claim 1 wherein the conductive material includes aluminum and a material used to form the wire bond includes copper.

6. The method of claim 1 wherein the second trench is positioned in an area where the splash will form when the wire bond is subsequently formed in the wire bond region.

7. The method of claim 1 wherein a volume of the second trench is large enough to contain at least 40 percent of the splash.

8. The method of claim 1 wherein an inner edge of the second trench is positioned at or beyond an expected outer edge of a capillary chamfer region of the wire bond.

9. The method of claim 1 wherein a material used to form the wire bond is at least twice as hard as the conductive material.

10. A method comprising:
    receiving an integrated circuit that includes an external bond pad and a passivation layer under the external bond pad, the passivation layer includes a first trench that extends only partially through the passivation layer so that a portion of the passivation layer remains between the external bond pad and a last metal layer of the integrated circuit and a portion of the external bond pad fills the first trench, and the external bond pad includes a second trench directly over the first trench, the second trench is positioned around at least a portion of a perimeter of a wire bond region, wherein an inner edge of the first trench is positioned at or beyond an expected outer edge of a capillary chamfer region of the wire bond; and
    forming a wire ball bond in the wire bond region of the external bond pad, a splash of the external bond pad moves into the second trench as the ball bond is formed.

11. The method of claim 10 wherein a volume of the second trench is large enough to contain at least 40 percent of the splash.

12. The method of claim 10 wherein a material used to form the wire bond is harder than a material used to form the external bond pad.

13. The method of claim 10 wherein the second trench is continuous around the perimeter of the wire bond region.

14. The method of claim 10 wherein the passivation layer and the external bond pad include a respective plurality of the first and second trenches around the perimeter of the wire bond region, the second trenches are positioned and sized to contain at least a portion of the splash of the conductive bond pad when the wire bond is formed in the wire bond region.

15. The method of claim 10 wherein the passivation layer is over only a portion of the last metal layer and the external bond pad directly contacts another portion of the last metal layer.

16. The method of claim 10 wherein an inner edge of the second trench is positioned at or beyond an expected outer edge of a capillary chamfer region of the wire bond.

17. A semiconductor device comprising:
  an integrated circuit including an external bond pad, the external bond pad includes a trench around at least a portion of a perimeter of a wire bond region;
  a passivation layer under the external bond pad, the passivation layer including a trench extending only partially through a thickness of the passivation layer, the trench in the passivation layer is positioned directly under the trench in the external bond pad, wherein an inner edge of the trench in the passivation layer is positioned at or beyond an outer edge of a capillary chamfer region of the wire bond; and
  a wire bond formed in the wire bond region, at least a portion of a splash of the external bond pad is contained in the trench in the external bond pad.

18. The device of claim 17 wherein an inner edge of the trench in the external bond pad is positioned at or beyond an outer edge of a capillary chamfer region of the wire bond.

19. The device of claim 17 wherein a volume of the trench in the external bond pad is large enough to contain at least 40 percent of the splash.

20. The device of claim 17 further comprising:
  a last metal layer contact in the integrated circuit, the passivation layer covers only a portion of the last metal layer contact and the external bond pad is in direct contact with another portion of the last metal layer contact.

* * * * *